(12) United States Patent
Hahto et al.

(10) Patent No.: US 10,153,134 B1
(45) Date of Patent: Dec. 11, 2018

(54) PLASMA GENERATION SYSTEM

(71) Applicant: Nissin Ion Equipment Co., Ltd., Minami-Ku-Kyoto (JP)

(72) Inventors: Sami K. Hahto, Nashua, NH (US); George Sacco, Ipswich, MA (US); Matthew C. Farrell, Salem, MA (US)

(73) Assignee: Nissin Ion Equipment Co., Ltd., Minami-Ku, Kyoto (JP)

( * ) Notice: Subject to any disclaimer, the term of this patent is extended or adjusted under 35 U.S.C. 154(b) by 0 days.

(21) Appl. No.: 15/899,956

(22) Filed: Feb. 20, 2018

(51) Int. Cl.
*H01J 37/32* (2006.01)
*H01L 21/26* (2006.01)
*H01L 21/265* (2006.01)
*H01L 21/67* (2006.01)

(52) U.S. Cl.
CPC .... *H01J 37/3244* (2013.01); *H01J 37/32853* (2013.01); *H01L 21/26513* (2013.01); *H01L 21/67017* (2013.01)

(58) Field of Classification Search
CPC .. H01J 37/3171; H01J 37/08; H01J 37/32412; H01J 37/00; H01J 37/32862; H01J 2237/082; H01J 2237/022; H01J 2237/006; H01J 2237/24542; H01J 2237/30472; H01J 2237/0044; H01J 2237/061; H01J 2237/081; H01J 2237/0825; H01J 2237/083; H01J 2237/24507; H01J 2237/24521; H01J 2237/24535; H01J 2237/304; H01J 2237/31701; H01J 2237/31703; H01J 2237/31705; H01J 2237/31708; H01J 2237/3171; H01J 27/022; H01J 27/205; H01J 27/02; H01J 27/14; C23C 14/48; C23C 14/564; C23C 16/4405; H01L 21/265
USPC ......... 250/423 R, 492.21, 492.2, 492.3, 251; 315/111.81, 111.21, 111.91; 313/362.1
See application file for complete search history.

(56) References Cited

U.S. PATENT DOCUMENTS 6,815,697 B2 * 11/2004 Sano .................. H01J 37/3171
250/251
7,655,931 B2 * 2/2010 Gupta ..................... H01J 37/08
250/423 R
9,093,372 B2 * 7/2015 Koo ....................... C23C 14/48
(Continued)

FOREIGN PATENT DOCUMENTS

JP 11-354068 A 12/1999
JP 2008-034230 A 2/2008

*Primary Examiner* — David A Vanore
(74) *Attorney, Agent, or Firm* — Proskauer Rose LLP (57) ABSTRACT

A plasma generation system is provided that includes an elongated plasma chamber having a first elongated side wall substantially parallel to a longitudinal axis extending through the plasma chamber and a gas delivery device for delivering a gas to the plasma chamber via the first elongated side wall. The gas delivery device includes at least one input port for receiving a source of the gas and a plurality of output ports for delivering portions of the gas to the plasma chamber. The gas delivery device also includes a network of gas delivery paths comprising at least one branch point between the at least one input port and the plurality of output ports. The at least one branch point is directly connected to (i) an input node and (ii) at least two output nodes that are positioned offset from the branch point along the longitudinal axis.

22 Claims, 7 Drawing Sheets

(56) References Cited

U.S. PATENT DOCUMENTS

| | | | |
|---|---|---|---|
| 2008/0179545 A1* | 7/2008 | Perel | H01J 37/08 250/492.21 |
| 2009/0078890 A1* | 3/2009 | Yamashita | H01J 27/14 250/492.3 |
| 2009/0212232 A1* | 8/2009 | Yamashita | H01J 27/022 250/423 R |
| 2010/0154835 A1* | 6/2010 | Dimeo | C23C 14/564 134/31 |
| 2012/0255490 A1* | 10/2012 | Tanjo | H01J 37/08 118/638 |
| 2013/0260543 A1* | 10/2013 | Koo | C23C 14/48 438/515 |
| 2016/0086759 A1* | 3/2016 | Horsky | H01J 37/08 315/111.21 |

\* cited by examiner

PLASMA GENERATION SYSTEM

FIELD OF THE INVENTION

The invention relates generally to a gas delivery device for delivering one or more gases to a plasma chamber of a plasma generation system.

BACKGROUND OF THE INVENTION

Gas delivery to plasma chambers for the purpose of plasma generation is an essential feature of many technologies. For example, it is employed in ion implantation, which has been a critical technology in semiconductor device manufacturing and is currently used for many processes including fabrication of the p-n junctions in transistors, particularly for CMOS devices such as memory and logic chips. By creating positively-charged ions using input gases, where the ions contain the dopant elements required for fabricating transistors in silicon substrates, ion implanters can selectively control both the energy (hence implantation depth) and ion current (hence dose) introduced into the transistor structures. Gas delivery to plasma chambers for the purpose of plasma generation is not limited to ion implantation, however. This feature may also be used in chemical-vapor deposition, plasma doping processes that do not require the extraction of an ion beam from the generated plasma, and other applications involving producing plasma from one or more input gases.

A shortcoming associated with most of today's gas delivery devices is that they do not distribute gases uniformly to the plasma chamber. Substantial uniformity in gas distribution is desirable for generating uniform plasma density in a plasma chamber and, in some cases, for extracting an ion beam having uniform beam current density from the plasma chamber. For example, in the context of ion implantation, wafer substrate sizes have become larger due to the recent demand for higher production volume. In turn, ion source sizes, especially the height of an ion source that is substantially parallel to the wafer substrate, are also larger to cover the wafer substrate. Enlargement of ion sources is especially important when there is no means to enlarge an ion beam extracted from the ion source during ion beam transport and/or to scan the wafer substrate during ion beam irradiation such that most of the surface of the wafer substrate is irradiated by the beam.

Even though some of the existing gas delivery devices may be able to distribute gases relative uniformly to a plasma chamber, these gas delivery devices cannot achieve the uniformity quickly, especially over a wide dimension (e.g., a longitudinal length) of the plasma chamber due to the large difference in the lengths of the gas distribution lines of the gas delivery devices. Hence, the existing gas delivery devices often incur a delay in gas delivery timing among different sections of the plasma chamber. Therefore, there is a need for an improved gas delivery device that is capable of quicker and more uniform gas distribution to an elongated plasma chamber over a wide delivery range.

SUMMARY OF THE INVENTION

In one aspect, the invention features a plasma generation system that includes an elongated plasma chamber having a first elongated side wall substantially parallel to a longitudinal axis extending through the plasma chamber and a gas delivery device for delivering a gas to the plasma chamber via the first elongated side wall. The gas delivery device includes at least one input port for receiving a source of the gas and a plurality of output ports for delivering portions of the gas to the plasma chamber. The plurality of output ports are fluidly coupled to the first elongated side wall of the plasma chamber. The gas delivery device also includes a network of gas delivery paths comprising at least one branch point between the at least one input port and the plurality of output ports. The at least one branch point is directly connected to (i) an input node and (ii) at least two output nodes that are positioned offset from the branch point along the longitudinal axis. The input node comprises the at least one input port or an upstream branch point and each of the at least two output nodes comprises an output port of the plurality of output ports or a downstream branch point.

In another aspect, a method is provided for delivering a gas from a gas delivery device to an elongated plasma chamber in a plasma generation system. The elongated plasma chamber has a first elongated side wall substantially parallel to a longitudinal axis extending through the plasma chamber. The method includes receiving, by the gas delivery device at an input port, the gas from a gas source and delivering, by a network of gas delivery paths of the gas delivery device, at least a portion of the gas from the input port to a branch point of the gas delivery device. The method also includes delivering, by the network of gas delivery paths, the at least portion of the gas from the branch point to at least (i) a first output port of the gas delivery device offset from the branch point along the longitudinal axis and (ii) a second output of the gas delivery device offset from the branch point along the longitudinal axis. The branch point is connected to the first and second output ports. The method further includes providing, by the first and second output ports, the at least portion of the gas to the plasma chamber via the first elongated side wall of the plasma chamber.

Any of the above aspects can include one or more of the following features. In some embodiments, the gas is in a gaseous or vapor form. In some embodiments, the at least one input port comprises a plurality of input ports. Each of the plurality of input ports is configured to receive a different gas for delivery to the plasma chamber. In some embodiments, the at least one branch point of the gas delivery device comprises a plurality of branch points.

In some embodiments, the elongated plasma chamber is a component of an ion source. In some embodiments, the plasma chamber comprises a second elongated side wall that is substantially parallel to the longitudinal axis. The second elongated side wall includes an aperture for extracting an ion beam from the plasma chamber for delivery to a wafer. The extracted ion beam can be substantially equal to or larger than a size of the wafer in a dimension perpendicular to a wafer scanning direction and a direction of delivery of the ion beam to the wafer.

In some embodiments, the plurality of output ports are aligned along the longitudinal axis on the first elongated side wall of the plasma chamber. In some embodiments, the plurality of output ports are aligned at equidistance along the longitudinal axis on the first elongated side wall of the plasma chamber.

In some embodiments, one of the plurality of output ports is disposed at a first end of the elongated side wall along the longitudinal axis and another one of the plurality of output ports is disposed at a second end of the elongated side wall along the longitudinal axis opposite of the first end, such that the gas from the input port is transferred to both the first and second ends of the plasma chamber substantially simultaneously. In some embodiments, the network of gas delivery paths is substantially symmetrically with respect to a transversal axis perpendicular to the longitudinal axis, where the transversal axis extends through the source of the gas.

In some embodiments, the plasma generation system further comprises two plates configured to mate with each other to form the gas delivery device that comprises the at least one input port, the plurality of output ports, and the network of gas delivery paths. The two plates can have corresponding series of grooves etched thereon.

In some embodiments, the plasma generation system further comprises a heater in thermal communication with the gas delivery device for increasing a temperature of the gas circulating through the gas delivery device and preventing condensation of the gas inside of the gas delivery device. The heater can comprise a coil heater substantially surrounding the gas delivery device. In some embodiments, the plasma generation system further comprises a vaporizer in fluid communication with the at least one input port of the gas delivery device for vaporizing a solid or liquid feed material to form the gas supplied to the at least one input port.

In some embodiments, the plurality of output ports are projected outward from the gas delivery device, the plurality of output ports configured for insertion through a corresponding plurality of holes on the first elongated side wall of the plasma chamber. In some embodiments, a liner is provided to cover an interior surface of the plasma chamber. The liner comprises a plurality of holes for receiving the plurality of output ports of the gas delivery device. In some embodiments, only the plurality of output ports of the gas delivery device are exposed in the interior surface of the plasma chamber.

In some embodiments, the at least two output nodes are offset from the branch point in opposite directions along the longitudinal axis. The at least two output nodes can be offset by about the same amount from the branch point along the longitudinal axis.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The advantages of the technology described above, together with further advantages, may be better understood by referring to the following description taken in conjunction with the accompanying drawings. The drawings are not necessarily to scale, emphasis instead generally being placed upon illustrating the principles of the technology.

DESCRIPTION OF THE INVENTION

Figure 1:
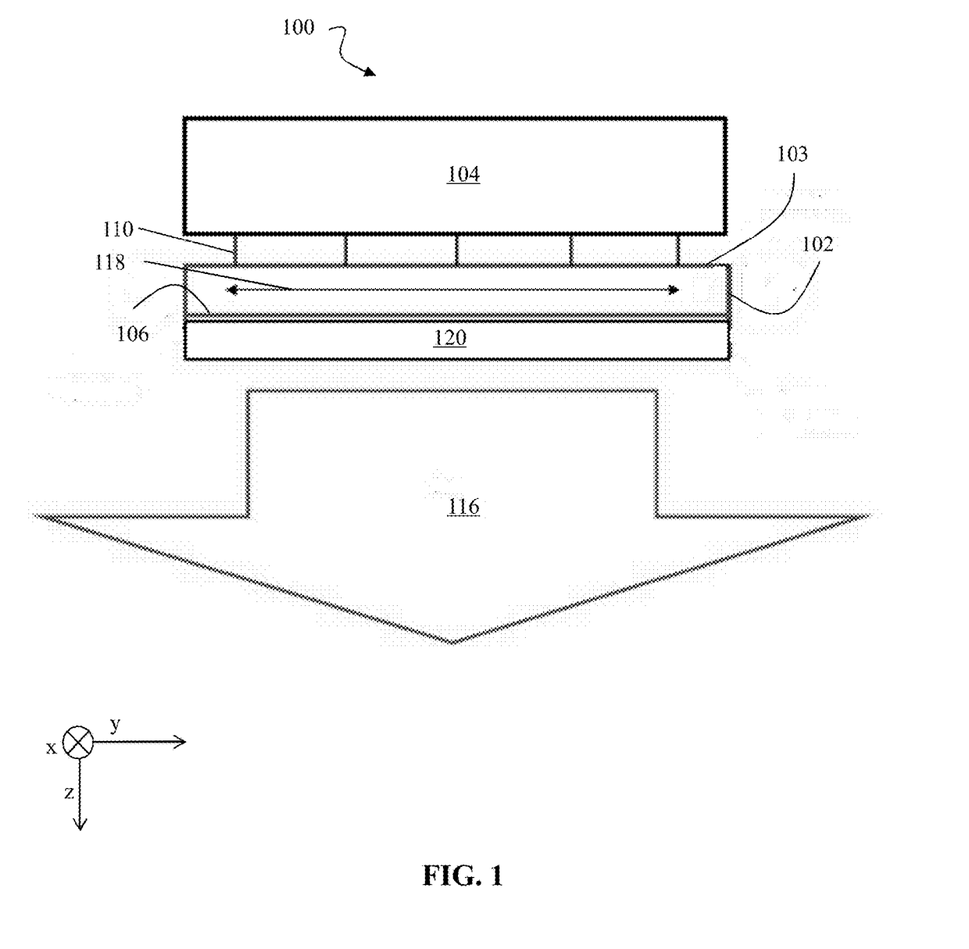
FIG. 1 shows a structural diagram of an exemplary plasma generation system, according to some embodiments of the present invention.

FIG. 1 shows a structural diagram of an exemplary plasma generation system 100, according to some embodiments of the present invention. As shown, the plasma generation system 100 includes a plasma chamber 102 defining a longitudinal axis 118 along the long dimension of the plasma chamber 102. The plasma chamber 102 can be elongated with a first elongated side wall 103 that is closet to a gas delivery device 104 and a second elongated side wall 106 opposite of the first side wall 103. The longitudinal axis 118 extends substantially parallel to the first and second elongated side walls 103, 106. The plasma generation system 100 also includes the gas delivery device 104 that comprises one or more gas output ports 110. The gas delivery device 104 is configured to introduce and control the introduction of one or more gaseous materials from at least one gas source (not shown) into the plasma chamber 102 via the output ports 110 that are fluidly coupled to the first elongated side wall 103. In operation, a plasma forms within the plasma chamber 102 from ionization of the gas supplied by the gas delivery device 104.

In some embodiments, the plasma generation system 100 is an ion source configured to produce an ion beam 116 for implantation into, for example, a wafer substrate (not shown). In this configuration, the ions in the plasma of the plasma chamber 102 can be extracted via an extraction aperture (not shown) on the second elongated side wall 106 that is substantially parallel to the longitudinal axis 118. The extracted ions are adapted to form the ion beam 116 using an extraction system 120, which can include one or more extraction electrodes (not shown), such as a ground electrode, a suppression electrode, a puller electrode and a plasma electrode. The longitudinal axis 118 can be substantially perpendicular to the direction of propagation of the ion beam 116. In some embodiments, the length of the extracted ion beam 116 in the longitudinal direction 118 (thus the length of the extraction aperture) is substantially equal to or larger than the dimension of the wafer substrate in the longitudinal direction 118 (i.e., along the y-axis as shown in FIG. 1), which is the dimension perpendicular to a wafer scanning direction and the direction of delivery of the ion beam (i.e., along the z-axis of FIG. 1).

In general, the plasma chamber 102 can have a rectangular shape that is longer in the longitudinal direction 118 along the y-axis than in the traverse directions along the x-axis and z-axis. The plasma chamber 102 can also have other shapes, such as a cylindrical shape for example. The length of the plasma chamber 102 along the longitudinal direction 118 may be about 450 mm. The extraction aperture located on the second elongated side wall 106 of the plasma chamber 102, which extends along the length of the plasma chamber 102, can also be about 450 mm long. As shall be understood by a person of ordinary skill in the art, even though the plasma generation system 100 can operate as an ion source for the purpose of ion implantation, the same system can be easily adapted to other applications that require plasma generation, such as chemical vapor deposition and plasma doping.

Figure 2A:
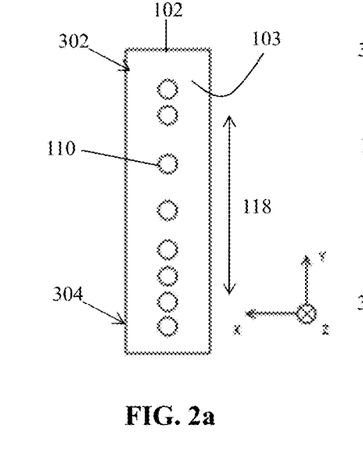
FIGS. 2a and 2b show exemplary arrangements of the output ports of the gas delivery device relative to the first elongated side wall of the plasma chamber of the plasma generation system of FIG. 1, according to some embodiments of the present invention.
Figure 2B:
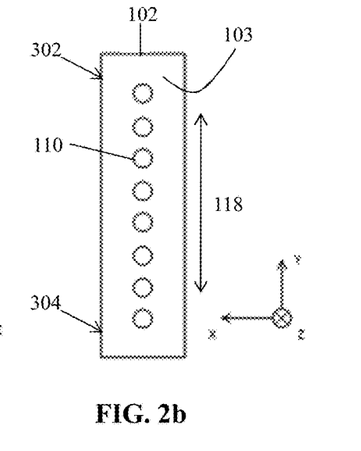

FIGS. 2a and 2b show exemplary arrangements of the output ports 110 of the gas delivery device 104 relative to the first elongated side wall 103 of the plasma chamber 102 of the plasma generation system 100 of FIG. 1, according to some embodiments of the present invention. The multiple output ports 110 are generally aligned along the longitudinal axis 118 (i.e., the y-axis as shown in FIGS. 2a and 2b) relative to the first elongated side wall 103 of the plasma chamber 102. The output ports 110 do not need to be evenly spaced along the longitudinal axis 118, as shown in FIG. 2a. In alternative embodiments, as shown in FIG. 2b, the output ports are aligned at equidistance along the longitudinal axis 118. Further, the multiple output ports 110 can be distributed along the longitudinal axis 118 such that there is at least one output port 110 at one end of the elongated side wall 103 and at least one output port 110 at the other/opposite end of the elongated side wall 103. This allows the input gas from the gas delivery device 104 to reach the entire length of the elongated plasma chamber 102 via the output ports 110.

Figure 3:
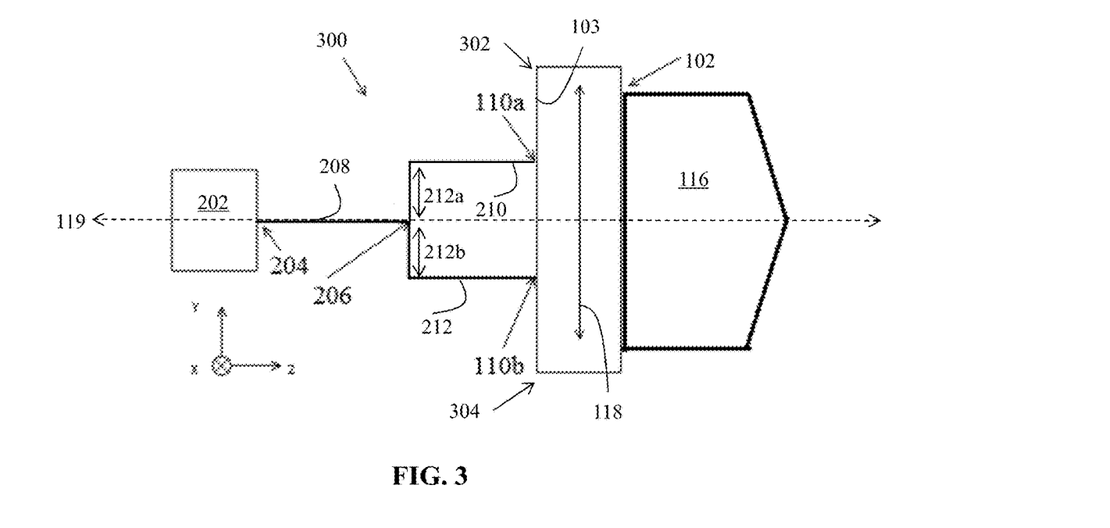
FIG. 3 shows an exemplary implementation of the gas delivery device of the plasma generation system of FIG. 1, according to some embodiments of the present invention.

FIG. 3 shows an exemplary implementation 300 of the gas delivery device 104 of the plasma generation system 100 of FIG. 1, according to some embodiments of the present invention. The gas delivery device 300 includes at least one gas source 202 and at least one input port 204 for receiving a gas from the gas source 202. The gas delivery device 300 further includes a network of delivery paths for transporting the gas from the input port 204 to the plasma chamber 102 via the multiple output ports 110 of the gas delivery device 300 that are fluidly coupled to the first elongated side wall 103 of the plasma chamber 102. The output ports 110 can be disposed substantially along the longitudinal direction 118 relative to the first elongated side wall 103 of the plasma chamber 102, as illustrated in FIG. 2a or 2b. In the embodiment as shown in FIG. 3, the gas delivery device 300 comprises one input port 204 and multiple output ports 110. The gas provided by the gas source 202 to the input port 204 can be in a gaseous or vapor form and comprise at least one of $AsH_3$, $PH_3$, $BF_3$, $SiF_4$, Xe, Ar, $N_2$, $GeF_4$, $CO_2$, CO, $CH_3$, $SbF_5$, $CH_6$, $GaCl_3$, $SbF_3$, $InCl_3$, $SnCl_2$ and $SnF_2$, for example. In alternative embodiments, the gas delivery device 300 comprises multiple input ports with each input port configured to receive a different gas for delivery to the plasma chamber 102.

As shown, the network of delivery paths of the gas delivery device 300 includes at least one branch point 206 between the input port 204 and the output ports 110. Each branch point 206 is (i) directly connected to an input node by a delivery edge/path 208 that is upstream from the branch point 206 and (ii) directly connected to at least two output nodes by two respective delivery edges/paths 210, 212 that are downstream from the branch point 206. In the embodiment of FIG. 3, the input node that is directly connected to the branch point 206 by the path 208 is the input port 204, and the output nodes that are directly connected to the branch point 206 by the paths 210, 212 are the output ports 110a, 110b, respectively. However, in general, an input node of a branch point can be an input port or another (upstream) branch point, and an output node can be an output port or another (downstream) branch point. The gas delivery device 300 can also include multiple branch points between the input port 204 and the output ports 110.

In some embodiments, each of the output nodes that are connected to a branch point is positioned offset relative to the branch point along the longitudinal axis 118. The offsets of the output nodes can be in opposite directions relative to the branch point. As shown in FIG. 3, each of the output ports 110a, 110b is positioned offset longitudinally relative to the branch point 206 to which they are connected. Further, the offsets are in opposite directions relative to the branch point 206. As shown, the output port 110a is offset above the branch point 206 along the longitudinal axis 118 and the output port 110b is offset below the branch point 206 along the longitudinal axis 118.

In some embodiments, the offsets of the output nodes relative to the branch point are about the same amount in the opposite directions. As shown in FIG. 3, the longitudinal distance 212a between the branch point 206 and the output port 110a can be about the same as the longitudinal distance 212b between the branch point 206 and the output port 110b. The difference between the distances 212a and 212b can be zero or small, such as within 10%. Thus, the network of gas delivery paths of the gas delivery device 300 can be substantially symmetrical with respect to a transversal axis 119 that is perpendicular to the longitudinal axis 118 and extends through the most upstream branch point of the gas delivery device 300, which is the branch point 206 in this example. Such symmetrical or near symmetrical arrangement of the output nodes relative to a branch point facilitates fast and substantially uniform distribution of the input gas from the input port 204 to the output ports 110 such that each output port 110 receives about an equal portion of the input gas nearly simultaneously (i.e., without a large delay in time and without a large difference in quantity of the input gas dispensed to the elongated plasma chamber 102 from the various output ports 110). Specifically, using the symmetrical or near symmetrical gas delivery network of the gas delivery device 300, a gas can be delivered from the input port 204 to one end 302 (i.e., the upper end) of the elongated side wall 103 of the plasma chamber 102 and the other end 304 (i.e. the lower end) of the elongated side wall 103 of the plasma chamber 102 along the longitudinal axis 118 substantially uniformly and at about the same time. In alternative arrangements, the offsets of output nodes (i.e., output ports 110a, 110b) relative to a branch point (i.e., branch point 206) are in the same direction along the longitudinal axis 118, such as both above or below the branch point 206, in which case asymmetrical arrangement of the output ports 110 relative to the transversal axis 119 is achieved.

Figure 4:
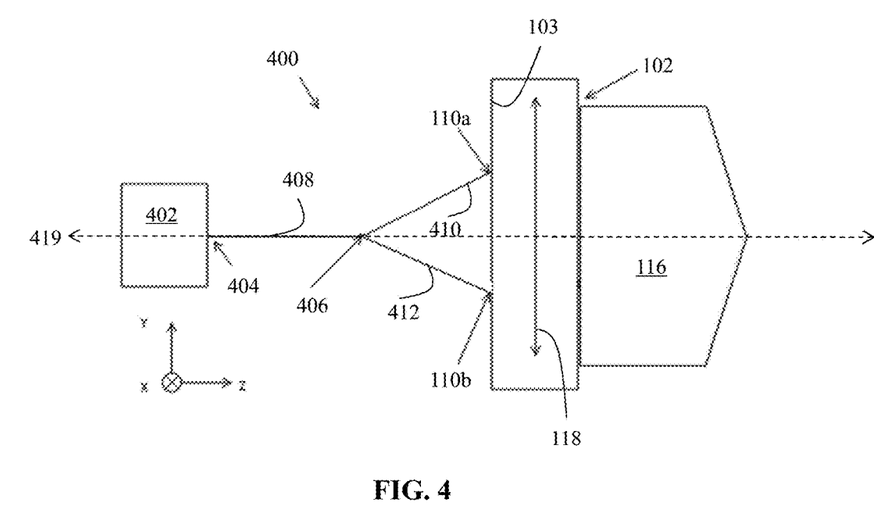
FIG. 4 shows another exemplary implementation of the gas delivery device of the plasma generation system of FIG. 1, according to some embodiments of the present invention.

FIG. 4 shows another exemplary implementation 400 of the gas delivery device 104 of the plasma generation system 100 of FIG. 1, according to some embodiments of the present invention. Similar to the exemplary gas delivery device design 300 of FIG. 3, the gas delivery device 400 includes at least one gas source 402 and at least one input port 404 for receiving a gas from the gas source 402. The gas delivery device 400 further includes a network of delivery paths for transporting the input gas from the input port 404 to the plasma chamber 102 via the multiple output ports 110 of the gas delivery device 400 that are fluidly coupled to the first elongated side wall 103 of the plasma chamber 102. The output ports 110 can be disposed substantially along the longitudinal direction 118 relative to the first elongated side wall 103 of the plasma chamber 102, as illustrated in FIG. 2a or 2b.

As shown, the network of delivery paths of the gas delivery device 400 includes at least one branch point 406 between the input port 404 and the output ports 110. The branch point 406 is (i) directly connected to an input node (i.e., the input port 404) by a delivery edge/path 408 that is upstream from the branch point 406 and (ii) directly connected to at least two output nodes (i.e., output ports 110a and 110b) by two respective delivery edges/paths 410, 412 that are downstream from the branch point 406. Unlike the delivery paths 210, 212 of FIG. 3, where each path comprises two segments (a vertical and horizontal segment) to reach the respective output node (output port 110a or 110b), each of the delivery paths 410, 412 is a single diagonal straight segment connecting the branch point 406 to the respective output node (output port 110a or 110b). This design 400 illustrates that the delivery paths of the gas delivery device 140 do not need to be vertical or horizontal or even straight, they can be curved and/or diagonal or have any other shape/orientation for connecting a branch point to an input node or an output node.

Further, as shown in FIG. 4, each of the output ports 110a, 110b that is connected to the branch point 406 is positioned offset relative to the branch point 406 along the longitudinal axis 118. As shown, the offsets of the output ports 110a, 110b are in opposite directions along the longitudinal axis 118 from the branch point 206. Thus, the gas delivery device configuration 400 of FIG. 4 demonstrates that symmetry or near symmetry of the delivery network is achieved relative to the transversal axis 419, as explained above with respect to FIG. 3, such that a gas can be delivered from the input port 204 to the plasma chamber 102 via the output ports 110a, 110b substantially uniformly and at about the same time.

Figure 5:
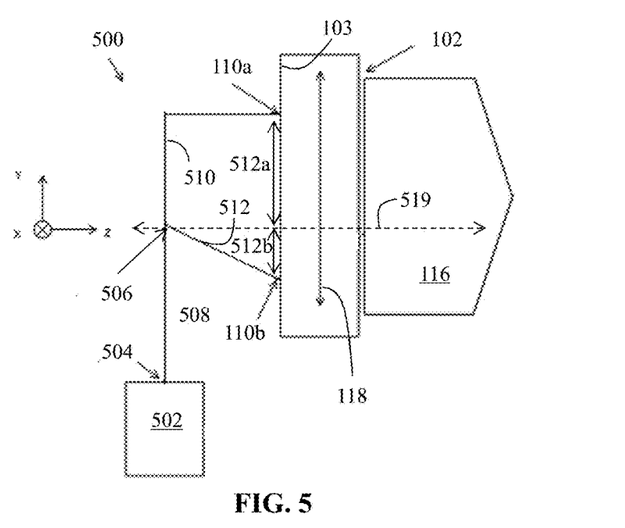
FIG. 5 shows yet another exemplary implementation of the gas delivery device of the plasma generation system of FIG. 1, according to some embodiments of the present invention.

FIG. 5 shows yet another exemplary implementation 500 of the gas delivery device 104 of the plasma generation system 100 of FIG. 1, according to some embodiments of the present invention. Similar to the exemplary gas delivery device designs 300 and 400 of FIGS. 3 and 4, respectively, the gas delivery device 500 includes at least one gas source 502 and at least one input port 504 for receiving a gas from the gas source 502. The gas delivery device 500 further includes a network of delivery paths for transporting the gas from the input port 504 to the plasma chamber 102 via the multiple output ports 110 of the gas delivery device 500 that are fluidly coupled to the first elongated side wall 103 of the plasma chamber 102. The output ports 110 can be disposed substantially along the longitudinal direction 118 relative to the first elongated side wall 103 of the plasma chamber 102, as illustrated in FIG. 2a or 2b.

As shown, the network of delivery paths of the gas delivery device 500 includes at least one branch point 506 between the input port 504 and the output ports 110. The branch point 506 is (i) directly connected to an input node (i.e., the input port 504) by a delivery edge/path 508 that is upstream from the branch point 506 and (ii) directly connected to at least two output nodes (i.e., output ports 110a and 110b) by two respective delivery edges/paths 510, 512 that are downstream from the branch point 506. The delivery path 510 between the branch point 506 and the output port 110a comprises two segments (a vertical and horizontal segment). The delivery path 512 between the branch point 506 and the output port 110b comprises a single diagonal straight segment. Again, each of the output nodes (i.e., output ports 110a, 110b) that are connected to the branch point 506 is positioned offset relative to the branch point 506 along the longitudinal axis 118. As shown, the offsets 512a, 512b of the output nodes (i.e., output ports 110a, 110b) are in opposite directions along the longitudinal axis 118 relative to the branch point 506. However, the offsets 512a, 512b do not have the same lengths along the longitudinal axis 118. Thus, the gas delivery device configuration 500 of FIG. 5 is asymmetric relative to the transversal axis 519 that is perpendicular to the longitudinal axis 118 and extends through the most upstream branch point 506.

Figure 6:
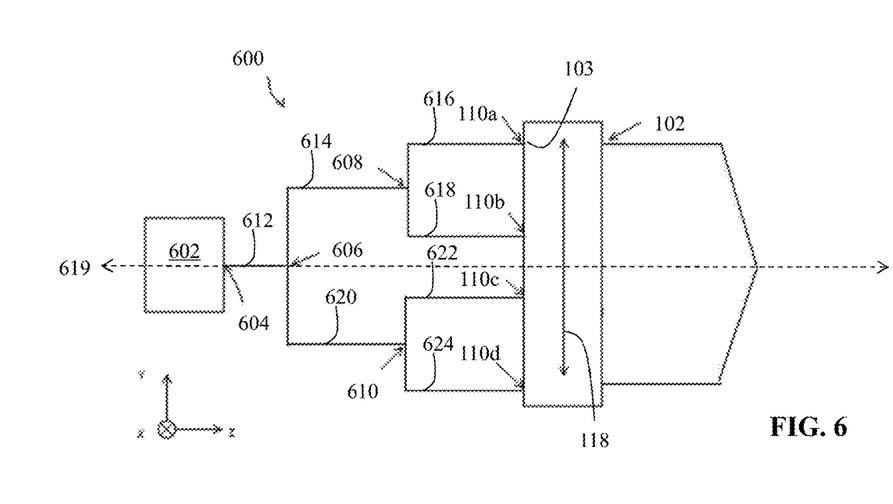
FIG. 6 shows yet another exemplary implementation of the gas delivery device of the plasma generation system of FIG. 1, according to some embodiments of the present invention.

FIG. 6 shows yet another exemplary implementation 600 of the gas delivery device 104 of the plasma generation system 100 of FIG. 1, according to some embodiments of the present invention. Similar to the exemplary gas delivery device designs 300, 400 and 500 of FIGS. 3-5, respectively, the gas delivery device 600 includes at least one gas source 602 and at least one input port 604 for receiving a gas from the gas source 602. The gas delivery device 600 further includes a network of delivery paths for transporting the gas from the input port 604 to the plasma chamber 102 via the multiple output ports 110 of the gas delivery device 600 that are fluidly coupled to the first elongated side wall 103 of the plasma chamber 102. The output ports 110 can be disposed substantially along the longitudinal direction 118 relative to the first elongated side wall 103 of the plasma chamber 102, as illustrated in FIG. 2a or 2b.

As shown, the network of delivery paths of the gas delivery device 600 includes three branch points 606, 608 and 610 between the input port 604 and the output ports 110. Each branch point is directly connected to an input node by an upstream delivery edge/path, where the input node is either an input port or an upstream branch point. Each branch point is also directly connected to at least two output nodes by corresponding downstream delivery edges/paths, where each output node is either an output port or a downstream branch point. Specifically, in FIG. 6, the branch point 606 is directly connected to the input port 604 by the delivery path 612 and to the downstream branch points 608, 610 by the delivery paths 614, 620, respectively. The branch point 608 is directly connected to the upstream branch point 606 by the delivery path 614 and to the output ports 110a, 110b by the delivery paths 616, 618, respectively. The branch point 610 is directly connected to the branch point 606 by the delivery path 620 and to the output ports 110c, 110d by the delivery paths 622, 624, respectively.

For each of the branch points 606, 608, 610, its output nodes are positioned offset at about equal distance and opposite directions relative to that branch point along the longitudinal axis 118. Thus, the network of gas delivery paths of the gas delivery device 600 is substantially symmetrical with respect to the transversal axis 619 that is perpendicular to the longitudinal axis 118 and extends through the most upstream branch point 606. In general, having multiple branch points in a gas delivery device, especially arranged in a symmetrical manner with multiple output ports, facilitates quick and substantially uniform distribution of gas from the gas source 602 to the plasma chamber 102 along the elongated sidewall 103.

Figure 7:
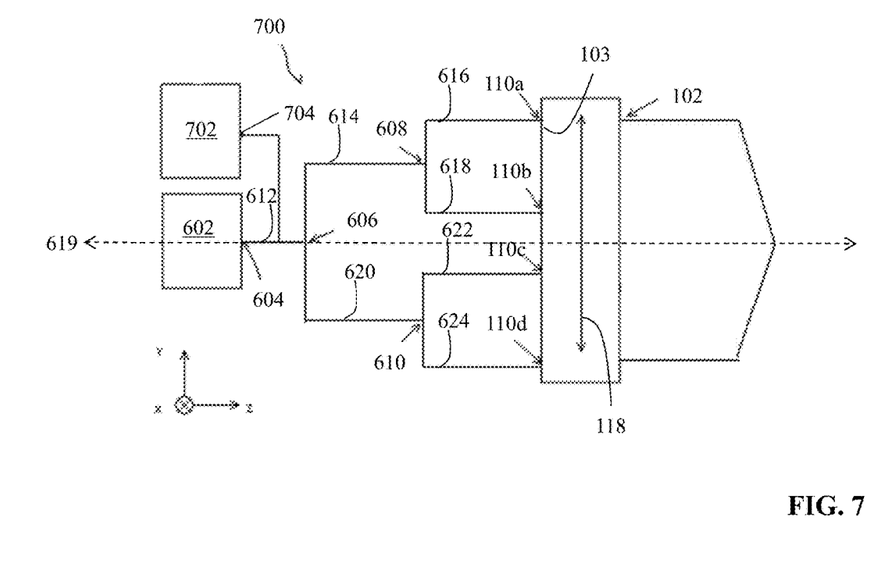
FIG. 7 shows yet another exemplary implementation of the gas delivery device of the plasma generation system of FIG. 1, according to some embodiments of the present invention.

FIG. 7 shows yet another exemplary implementation 700 of the gas delivery device 104 of the plasma generation system 100 of FIG. 1, according to some embodiments of the present invention. The gas delivery device implementation 700 of FIG. 7 is substantially similar to the implementation 600 of FIG. 6 except for the addition of a second gas source 702 and a second input port 704, the combination of which is configured to provide a second gas to the plasma chamber 102. The second gas can be a dopant, in either gas or vapor form, or a diluent, in either gas or vapor form, for mixing with the gas from the first gas source 602 and first input port 612 or for supplying to the output ports 110 without mixing. Generally, the gas delivery device 104 can be easily configured to have one or more gas sources and input ports for delivering one or more gases to the plasma chamber 102, as understood by one of ordinary skill in the art.

Figure 8:
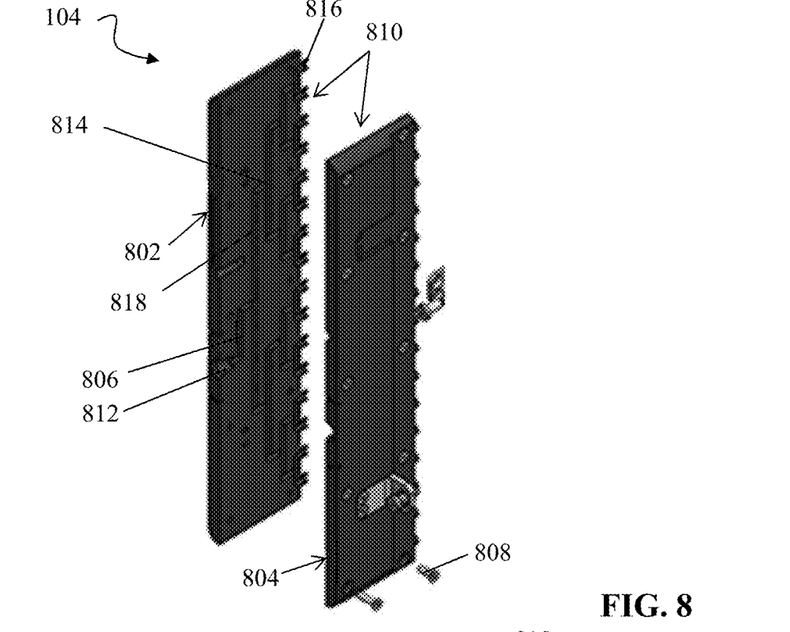
FIG. 8 shows an exemplary configuration of the gas delivery device of the plasma generation system of FIG. 1, according to some embodiments of the present invention.

FIG. 8 shows an exemplary configuration of the gas delivery device 104 of the plasma generation system 100 of FIG. 1, according to some embodiments of the present invention. A manifold 810 representing the network of gas delivery paths of the gas delivery device 104 can be constructed from two plates 802, 804 that are configured to mate with each other. At least one plate has a series of grooves 806 etched thereon, which includes one or more input ports 812, branch points 814, edges/delivery paths 818, and output ports 816, as described above with reference to FIGS. 3-7. In some embodiments, only one of the plates 802 or 804 has the series of grooves 806 etched thereon and the other plate is smooth, such that when the two plates 802, 804 are aligned and mated to each other to form the manifold 810 the smooth plate provides a flat cover for the grooves on the etched plate. In alternative embodiments, both plates 802, 804 have matching grooves 806 etched thereon, such that when the two plates 802, 804 are aligned and mated to each other the grooves 806 on the plates also match to form opposite sides of the manifold 810. The two plates 802, 804 can be mated and attached together with bolts 808 or by other engagement means. The plates 802, 804 can be constructed from a metallic material, such as graphite or aluminum. Generally, constructing the manifold 810 from two mating plates facilitates etching of the network of gas delivery paths, regardless of its complexity. Further, the two-plated structure enables easier maintenance of the manifold 810.

Figure 9:
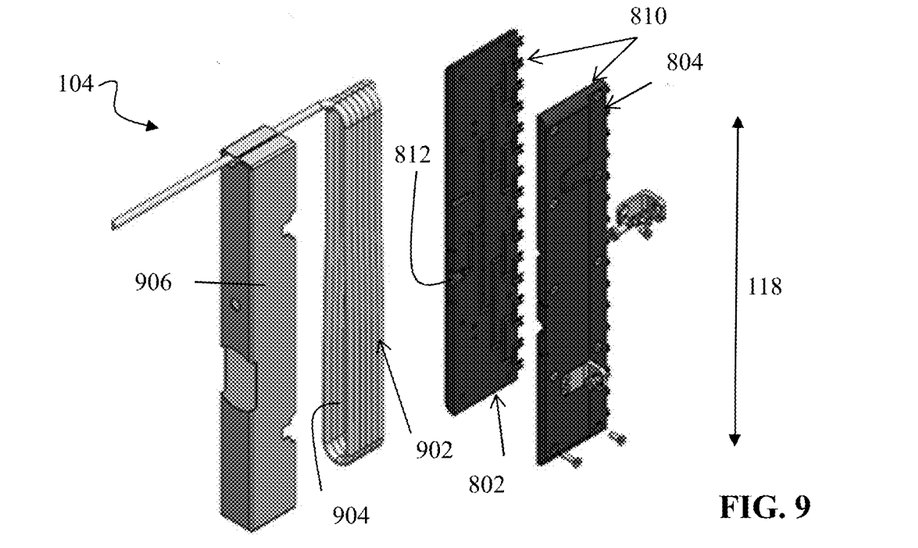
FIG. 9 shows another exemplary configuration of the gas delivery device of the plasma generation system of FIG. 1, according to some embodiments of the present invention.

FIG. 9 shows another exemplary configuration of the gas delivery device 104 of the plasma generation system 100 of FIG. 1, according to some embodiments of the present invention. In addition to the two opposing plates 802, 804 that form the manifold 810, as described above in FIG. 8, the gas delivery device 104 can also include a heater 902 in thermal communication with the manifold 810 for heating and maintaining the gas circulating through the manifold 810 in a vapor state and preventing condensation of the gas inside of the gas delivery device 104. This is advantageous in situations where the temperature in the manifold 810 is low, which can cool the vapor that is traveling through the manifold 810, thereby clogging the delivery paths and adversely affecting gas delivery to the plasma chamber 102. The heater 902 can be a coiled heater, as shown in FIG. 9. The coiled heater 902 can wrap around the manifold 810 in the longitudinal direction 118. Specifically, a central opening 904 formed by the coils of the heater 902 can be larger than the length of the plates 802, 804 in the longitudinal direction 118 such that at least a portion of the resulting manifold 810 can be surrounded by the coiled heater 902 lengthwise. The coiled heater 902 thus allows heating of a significant portion of the manifold 810. In some embodiments, the gas delivery device 104 further includes a heat shield 906 configured to cover the coiled heater 902, which in turn covers the manifold 810. Thus, at least a portion of the manifold 810 is surrounded by the coiled heater 902, which is encased by the heat shield 906. The heat shield 906 can further heat the manifold 810 by radiation heating.

Figure 10:
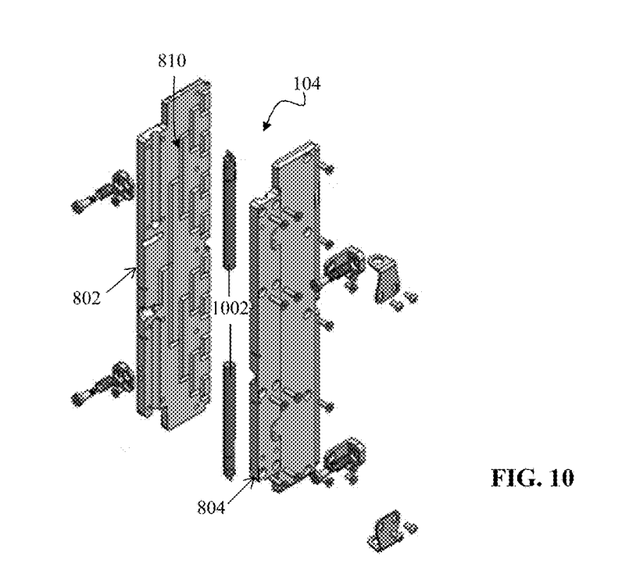
FIG. 10 shows yet another exemplary configuration of the gas delivery device of the plasma generation system of FIG. 1, according to some embodiments of the present invention.

FIG. 10 shows yet another exemplary configuration of the gas delivery device 104 of the plasma generation system 100 of FIG. 1, according to some embodiments of the present invention. Instead of using a coiled heater, such as the coiled heater 902 of FIG. 9, the gas delivery device 104 can use one or more localized heaters 1002 to heat certain regions of the manifold 810. As shown in FIG. 10, two vertical heaters 1002 can be positioned between the plates 802, 804 to heat the manifold 810 from within.

Figure 11:
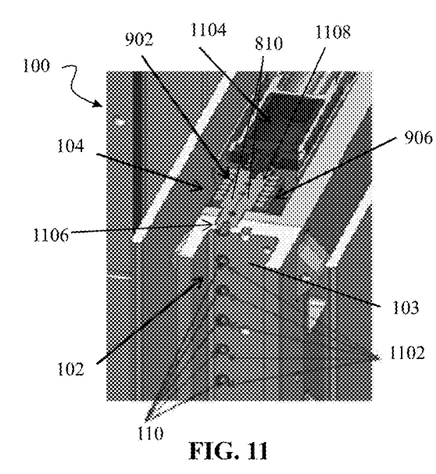
FIG. 11 shows an exemplary arrangement for coupling the gas delivery device to the plasm chamber of the plasma generation system of FIG. 1, according to some embodiments of the present invention.

FIG. 11 shows an exemplary arrangement for coupling the gas delivery device 104 to the plasm chamber 102 of the plasma generation system 100 of FIG. 1, according to some embodiments of the present invention. As shown, the plasma chamber 102 comprises a plurality of chamber walls, including the first elongated side wall 103 for receiving a gas from the gas delivery device 104. Specifically, the first elongated side wall 103 of the plasma chamber 102 has multiple holes 1102 that are adapted to align with respective ones of the gas output ports 110 of the gas delivery device 104. FIGS. 2a and 2b illustrate exemplary arrangements of the output ports 110 relative to the first elongated side wall 103. To couple the gas delivery device 104 to the plasma chamber 102 at the first elongated side wall 103, the output ports 110 are constructed to project outward from the output end 1106 the manifold 810 such that they insert into the corresponding ones of the holes 1102 of the first elongated side wall 103. The output end 1202 is generally defined as the end where the output ports 110 are located. Thus, after the gas delivery device 104 is coupled to the plasma chamber 102, only the projected output ports 110 of the gas delivery device 104 are visible from and exposed to the interior of the plasma chamber 102. This arrangement minimizes the exposure of the gas delivery device 104 to plasma sputtering in the interior of the plasma chamber 102, thereby alleviating potential damage to the gas delivery device 104.

In some embodiments, the gas delivery device 104 of FIG. 11 has a design similar to the implementation shown in FIG. 9, which includes the plates 802, 804 for forming the manifold 810, the coiled heater 902 and the heat shield 906. In some embodiments, a vaporizer 1104 is coupled to the input end 1108 of the manifold 810. Specifically, the vaporizer 1104 is configured to be in fluid communication with an input port of the manifold 810 to vaporize a solid or liquid feed material to form the gas supplied to the input port. In some embodiments, the material choice of the plates 802, 804 (e.g., graphite or aluminum) is dependent on the material of the vaporizer 1104. In some embodiments, the temperature of the vaporizer 1104 is controlled by adjusting the coil current of the heater 902 that surrounds the manifold 810.

Figure 12:
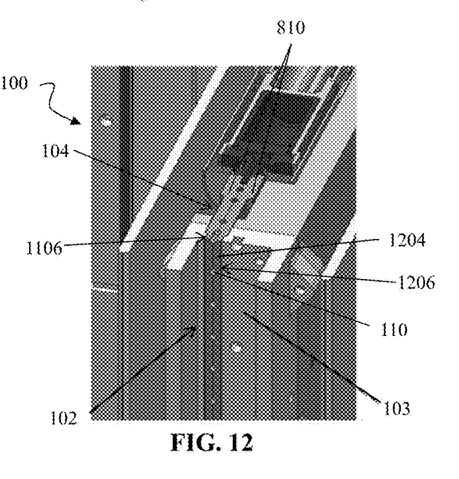
FIG. 12 shows another exemplary arrangement for coupling the gas delivery device to the plasm chamber of the plasma generation system of FIG. 1, according to some embodiments of the present invention.

FIG. 12 shows another exemplary arrangement for coupling the gas delivery device 104 to the plasm chamber 102 of the plasma generation system 100 of FIG. 1, according to some embodiments of the present invention. As shown, the output end 1106 of the manifold 810 of the gas delivery device 104 is inserted through a corresponding opening strip 1206 in the first elongated sidewall 103 of the plasm chamber 102 to couple the gas delivery device 104 to the chamber 102. Thus, after coupling, at least a longitudinal surface 1204 of the output end 1106 of the manifold 810 is exposed to the plasm chamber 102. In this case, a larger area of the gas delivery device 104 becomes vulnerable to plasma sputtering from within the plasma chamber 102 in comparison to the arrangement of FIG. 11. Specifically, the longitudinal surface 1204 of the output end 1106 of the manifold 810 that is exposed to the interior of the plasma chamber 102 has a larger area than the exposed output ports 110 of the manifold 810, as shown in FIG. 11.

Figure 13:
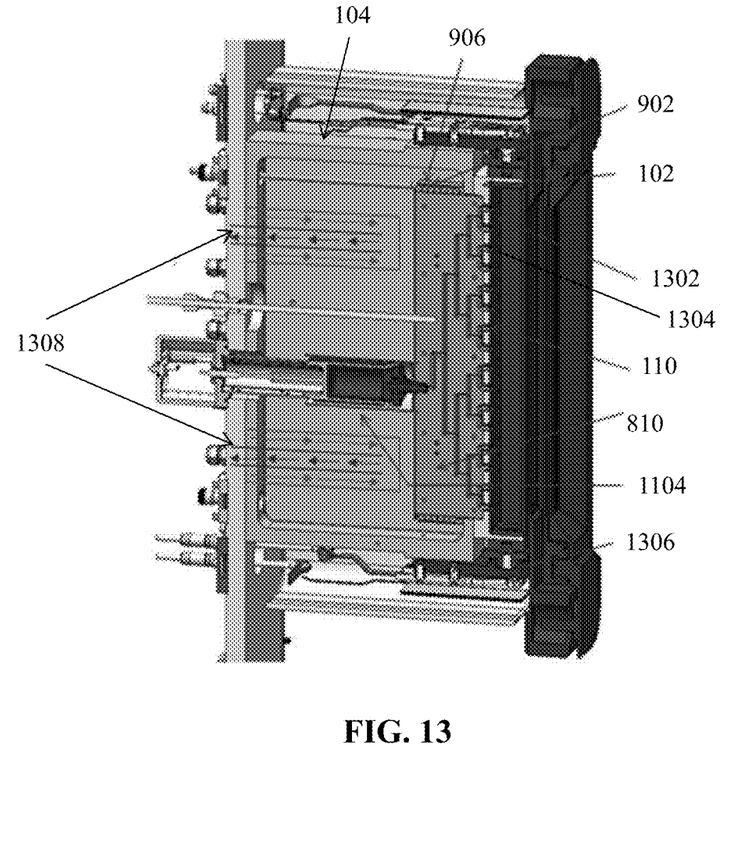
FIG. 13 shows an exemplary configuration of the plasma generation system of FIG. 1 where a liner is used to cover the interior of the plasma chamber, according to some embodiments of the present invention.

In some embodiments, the interior of the plasma chamber 102 is covered by a liner to further protect the gas delivery device 104 from plasma spluttering. FIG. 13 shows an exemplary configuration of the plasma generation system 100 of FIG. 1 where a liner 1302 is used to cover the interior of the plasma chamber 102, according to some embodiments of the present invention. As shown, the engagement between the gas delivery device 104 and the plasma chamber 102 is substantially similar to that of FIG. 11, where projected output ports 110 of the manifold 810 are inserted through the corresponding holes 1102 on the first elongated side wall 103 of the plasma chamber 102. Further, the liner 1302 is used to cover at least the first elongated side wall 103 in the interior of the plasma chamber 102 to further protect the gas delivery device 104 coupled thereto. In some embodiments, the liner 1302 includes multiple openings 1304 corresponding to the respective ones of the projected output ports 110. These openings 1304 in the liner 1302 are configured to receive the corresponding projected output ports 110 to allow the output ports 110 to dispense a gas to the plasma chamber 102, while the liner 1302 minimizes exposure of the gas delivery device 104 from the harsh environment within the plasma chamber 102. In some embodiments, the gas delivery device 104 further includes a source block 1306 that has one or more water passageways 1308 for blocking heat transfer from the manifold 810 to the vaporizer 1104. As shown, the source block 1306 substantially surrounds the vaporizer 1104 and at least a portion of the manifold 810.

In some embodiments, the liner 1302 is adapted to increase the temperature of the manifold 810 in the gas delivery device 104 due to radiation heating. To reduce such radiation heating, the contact area between the gas delivery device 104 and the liner should be minimized. Thus, it may be more desirable to adopt liner usage for the assembly of FIG. 11, where the only contact between the liner 1302 and the gas delivery device 104 is the projected output ports 110 of the manifold 810.

In some embodiments, a similar liner is used in the assembly of FIG. 12 to minimize plasma sputtering against the gas delivery device 104. For example, the liner can include multiple openings that correspond to respective ones of the output ports 110 of the gas delivery device 104 of FIG. 12, such that the exposed longitudinal surface 1204 at the output end 1106 of the manifold 810 is substantially covered by the liner.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed:

1. A plasma generation system comprising:
an elongated plasma chamber having a first elongated side wall substantially parallel to a longitudinal axis extending through the plasma chamber; and
a gas delivery device for delivering a gas to the plasma chamber via the first elongated side wall, the gas delivery device comprising:
at least one input port for receiving a source of the gas;
a plurality of output ports for delivering portions of the gas to the plasma chamber, the plurality of output ports being fluidly coupled to the first elongated side wall of the plasma chamber; and
a network of gas delivery paths comprising at least one branch point between the at least one input port and the plurality of output ports, the at least one branch point directly connected to (i) an input node and (ii) at least two output nodes that are positioned offset from the branch point along the longitudinal axis, wherein the input node comprises the at least one input port or an upstream branch point and each of the at least two output nodes comprises an output port of the plurality of output ports or a downstream branch point.

2. The plasma generation system of claim 1, wherein the gas is in a gaseous or vapor form.

3. The plasma generation system of claim 1, wherein the elongated plasma chamber is a component of an ion source.

4. The plasma generation system of claim 3, wherein the plasma chamber comprises a second elongated side wall that is substantially parallel to the longitudinal axis, the second elongated side wall including an aperture for extracting an ion beam from the plasma chamber for delivery to a wafer.

5. The plasma generation system of claim 4, wherein the extracted ion beam is substantially equal to or larger than a size of the wafer in a dimension perpendicular to a wafer scanning direction and a direction of delivery of the ion beam to the wafer.

6. The plasma generation system of claim 1, wherein the plurality of output ports are aligned along the longitudinal axis on the first elongated side wall of the plasma chamber.

7. The plasma generation system of claim 6, wherein the plurality of output ports are aligned at equidistance along the longitudinal axis on the first elongated side wall of the plasma chamber.

8. The plasma generation system of claim 1, wherein one of the plurality of output ports is disposed at a first end of the elongated side wall along the longitudinal axis and another one of the plurality of output ports is disposed at a second end of the elongated side wall along the longitudinal axis opposite of the first end, such that the gas from the input port is transferred to both the first and second ends of the plasma chamber substantially simultaneously.

9. The plasma generation system of claim 8, wherein the network of gas delivery paths is substantially symmetrical with respect to a transversal axis perpendicular to the longitudinal axis, the transversal axis extending through the at least one branch point.

10. The plasma generation system of claim 1, wherein the at least one input port comprises a plurality of input ports, each of the plurality of input ports being configured to receive a different gas for delivery to the plasma chamber.

11. The plasma generation system of claim 1, wherein the at least one branch point of the gas delivery device comprises a plurality of branch points.

12. The plasma generation system of claim 1, further comprising two plates configured to mate with each other to form the gas delivery device that comprises the at least one input port, the plurality of output ports, and the network of gas delivery paths.

13. The plasma generation system of claim 12, wherein the two plates have corresponding series of grooves etched thereon.

14. The plasma generation system of claim 1, further comprising a heater in thermal communication with the gas delivery device for increasing a temperature of the gas circulating through the gas delivery device and preventing condensation of the gas inside of the gas delivery device.

15. The plasma generation system of claim 14, wherein the heater comprises a coil heater substantially surrounding the gas delivery device.

16. The plasma generation system of claim 1, further comprising a vaporizer in fluid communication with the at least one input port of the gas delivery device for vaporizing a solid or liquid feed material to form the gas supplied to the at least one input port.

17. The plasma generation system of claim 1, wherein the plurality of output ports are projected outward from the gas delivery device, the plurality of output ports configured for insertion through a corresponding plurality of holes on the first elongated side wall of the plasma chamber.

18. The plasma generation system of claim 17, further comprising a liner covering an interior surface of the plasma chamber, the liner comprising a plurality of holes for receiving the plurality of output ports of the gas delivery device.

19. The plasma generation system of claim 18, wherein only the plurality of output ports of the gas delivery device are exposed in the interior surface of the plasma chamber.

20. The plasma generation system of claim 1, wherein the at least two output nodes are offset from the branch point in opposite directions along the longitudinal axis.

21. The plasma generation system of claim 20, wherein the at least two output nodes are offset by about the same amount from the branch point along the longitudinal axis.

22. A method for delivering a gas from a gas delivery device to an elongated plasma chamber in a plasma generation system, the elongated plasma chamber having a first elongated side wall substantially parallel to a longitudinal axis extending through the plasma chamber, the method comprising:

receiving, by the gas delivery device at an input port, the gas from a gas source;

delivering, by a network of gas delivery paths of the gas delivery device, at least a portion of the gas from the input port to a branch point of the gas delivery device;

delivering, by the network of gas delivery paths, the at least portion of the gas from the branch point to at least (i) a first output port of the gas delivery device offset from the branch point along the longitudinal axis and (ii) a second output of the gas delivery device offset from the branch point along the longitudinal axis, wherein the branch point is connected to the first and second output ports, and providing, by the first and second output ports, the at least portion of the gas to the plasma chamber via the first elongated side wall of the plasma chamber.

* * * * *